(12) United States Patent
Cherala et al.

(10) Patent No.: US 7,462,028 B2
(45) Date of Patent: Dec. 9, 2008

(54) PARTIAL VACUUM ENVIRONMENT IMPRINTING

(75) Inventors: Anshuman Cherala, Austin, TX (US); Pankaj B. Lad, DeSoto, TX (US); Ian M. McMackin, Austin, TX (US); Byung-Jin Choi, Austin, TX (US)

(73) Assignee: Molecular Imprints, Inc., Austin, TX (US)

( * ) Notice: Subject to any disclaimer, the term of this patent is extended or adjusted under 35 U.S.C. 154(b) by 0 days.

(21) Appl. No.: 11/695,263

(22) Filed: Apr. 2, 2007

(65) Prior Publication Data

US 2007/0275114 A1    Nov. 29, 2007

Related U.S. Application Data

(60) Provisional application No. 60/788,779, filed on Apr. 3, 2006.

(51) Int. Cl.
    *B28B 11/08* (2006.01)
(52) U.S. Cl. .................................. 425/385; 425/388
(58) Field of Classification Search .................. 425/385, 425/388; 264/259
    See application file for complete search history.

(56) References Cited

U.S. PATENT DOCUMENTS

| | | | |
|---|---|---|---|
| 4,279,628 A | 7/1981 | Wymer et al. | |
| 4,521,175 A | 6/1985 | Medwel | |
| 4,689,004 A | 8/1987 | Hunkel | |
| 4,767,584 A | 8/1988 | Siler | |
| 5,108,532 A * | 4/1992 | Thein et al. | ............ 156/285 |
| 5,338,177 A | 8/1994 | LeTouche | |
| 5,545,367 A | 8/1996 | Bae et al. | |
| 5,821,175 A | 10/1998 | Engelsberg | |
| 5,997,963 A | 12/1999 | Davison et al. | |
| 6,099,771 A | 8/2000 | Hudkins et al. | |
| 6,159,400 A | 12/2000 | Laquer | |
| 6,257,866 B1 | 7/2001 | Fritz et al. | |
| 6,416,311 B1 | 7/2002 | Springer et al. | |
| 6,461,524 B1 | 10/2002 | Tsuihiji et al. | |
| 6,764,386 B2 | 7/2004 | Uziel | |
| 6,869,890 B2 | 3/2005 | Noji et al. | |
| 6,932,934 B2 | 8/2005 | Choi et al. | |
| 7,019,819 B2 | 3/2006 | Choi et al. | |
| 2002/0018190 A1 | 2/2002 | Nogawa et al. | |
| 2002/0132482 A1 * | 9/2002 | Chou | ............ 438/692 |
| 2004/0129293 A1 | 7/2004 | Eichenberger | |
| 2004/0132301 A1 | 7/2004 | Harper et al. | |
| 2005/0064054 A1 | 3/2005 | Kasumi | |
| 2005/0072757 A1 | 4/2005 | McMackin et al. | |
| 2005/0145119 A1 * | 7/2005 | Tan et al. | ............ 101/3.1 |
| 2005/0184436 A1 * | 8/2005 | Jeong et al. | ............ 264/496 |
| 2007/0065532 A1 | 3/2007 | Choi et al. | |
| 2007/0114686 A1 | 5/2007 | Chio et al. | |

OTHER PUBLICATIONS

Choi et al, U.S. Appl. No. 11/749,909 entitled Method for expelling gas positioned between a substrate and a mold, filed May 17, 2007.

* cited by examiner

*Primary Examiner*—Yogendra Gupta
*Assistant Examiner*—Maria Veronica D Ewald
(74) *Attorney, Agent, or Firm*—Kelly K. Kordzik; Fish & Richardson P.C.

(57) ABSTRACT

The present invention is directed towards a method and a system to create and maintain a desired environment in the vicinity of a nano-imprint lithography template by creation of a partial vacuum using channels or holes in the template holding the nano-imprint mold.

5 Claims, 6 Drawing Sheets

PARTIAL VACUUM ENVIRONMENT IMPRINTING

This application for patent claims priority to U.S. Provisional Application Ser. No. 60/788,779, which is hereby incorporated by reference herein.

BACKGROUND INFORMATION

Nano-fabrication involves the fabrication of very small structures, e.g., having features on the order of nanometers or smaller. One area in which nano-fabrication has had a sizeable impact is in the processing of integrated circuits. As the semiconductor processing industry continues to strive for larger production yields while increasing the circuits per unit area formed on a substrate, nano-fabrication becomes increasingly important. Nano-fabrication provides greater process control while allowing increased reduction of the minimum feature dimension of the structures formed. Other areas of development in which nano-fabrication has been employed include biotechnology, optical technology, mechanical systems and the like.

An exemplary nano-fabrication technique is commonly referred to as imprint lithography. Exemplary imprint lithography processes are described in detail in numerous publications, such as United States patent application publication 2004/0065976 filed as U.S. patent application Ser. No. 10/264,960, entitled, "Method and a Mold to Arrange Features on a Substrate to Replicate Features having Minimal Dimensional Variability"; United States patent application publication 2004/0065252 filed as U.S. patent application Ser. No. 10/264,926, entitled "Method of Forming a Layer on a Substrate to Facilitate Fabrication of Metrology Standards"; and U.S. Pat. No. 6,936,194, entitled "Functional Patterning Material for Imprint Lithography Processes," all of which are assigned to the assignee of the present invention and all of which are incorporated by reference herein.

The fundamental imprint lithography technique disclosed in each of the aforementioned United States patent application publications and United States patent includes formation of a relief pattern in a polymerizable layer and transferring a pattern corresponding to the relief pattern into an underlying substrate. The substrate may be positioned upon a motion stage to obtain a desired position to facilitate patterning thereof. A template is employed spaced-apart from the substrate with a formable liquid present between the template and the substrate. The liquid is solidified to form a solidified layer that has a pattern recorded therein that is conforming to a shape of the surface of the template in contact with the liquid. The template is then separated from the solidified layer such that the template and the substrate are spaced-apart. The substrate and the solidified layer are then subjected to processes to transfer, into the substrate, a relief image that corresponds to the pattern in the solidified layer.

DETAILED DESCRIPTION

Figure 1:
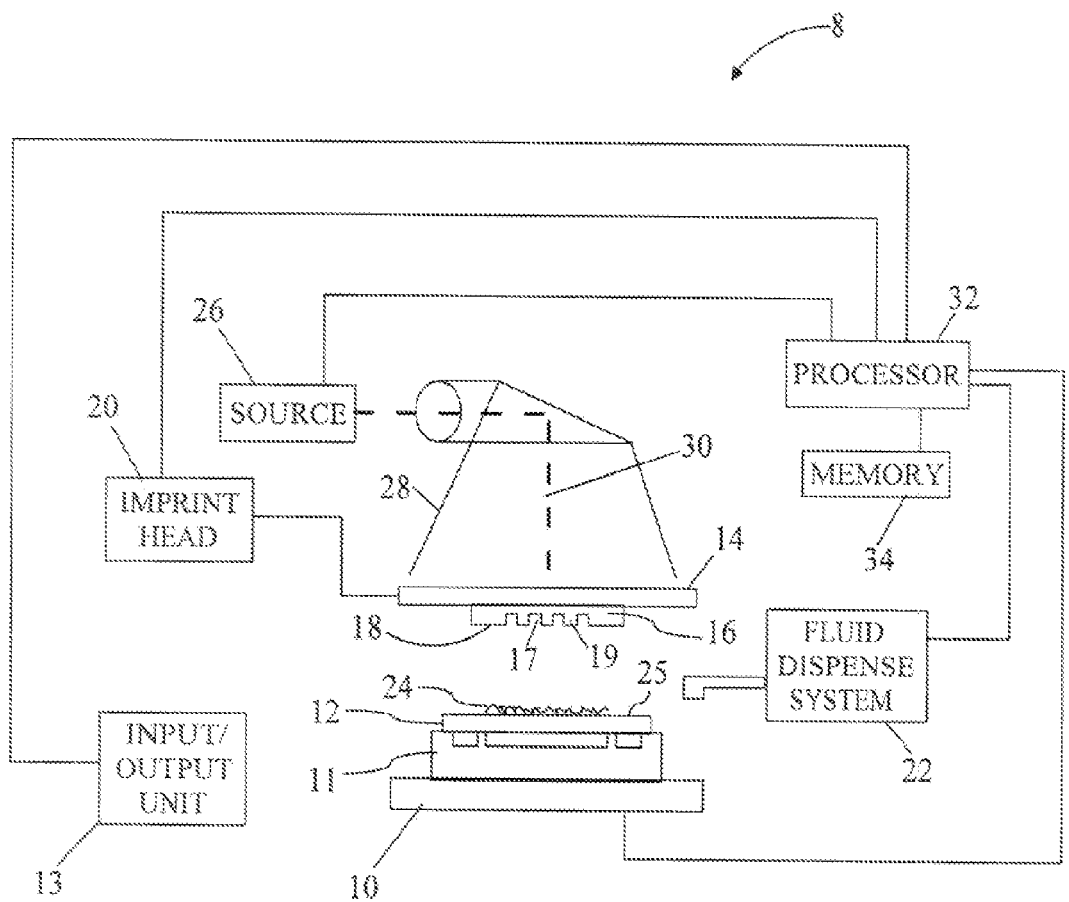
FIG. 1 is a simplified side view of a lithographic system having a template spaced-apart from a substrate.

Referring to FIG. 1, a system 8 to form a relief pattern on a substrate 12 includes a stage 10 upon which substrate 12 is supported and a template 14, having a patterning surface 18 thereon. In a further embodiment, substrate 12 may be coupled to a substrate chuck (not shown), the substrate chuck (not shown) being any chuck including, but not limited to, vacuum and electromagnetic.

Template 14 and/or mold 16 may be formed from such materials including but not limited to, fused-silica, quartz, silicon, organic polymers, siloxane polymers, borosilicate glass, fluorocarbon polymers, metal, and hardened sapphire. As shown, patterning surface 18 comprises features defined by a plurality of spaced-apart recesses 17 and protrusions 19. However, in a further embodiment, patterning surface 18 may be substantially smooth and/or planar. Patterning surface 18 may define an original pattern that forms the basis of a pattern to be formed on substrate 12.

Template 14 may be coupled to an imprint head 20 to facilitate movement of template 14, and therefore, mold 16. In a further embodiment, template 14 may be coupled to a template chuck (not shown), the template chuck (not shown) being any chuck including, but not limited to, vacuum and electromagnetic. A fluid dispense system 22 is coupled to be selectively placed in fluid communication with substrate 12 so as to deposit polymeric material 24 thereon. It should be understood that polymeric material 24 may be deposited using any known technique, e.g., drop dispense, spin-coating, dip coating, chemical vapor deposition (CVD), physical vapor deposition (PVD), and the like. Furthermore, polymeric material 24 may be positioned upon substrate 12 prior to establishing an environment between mold 16 and substrate 12, described further below, or in a further embodiment, fluid dispense system 22 may be positioned between substrate 12 and template 14.

A source 26 of energy 28 is coupled to direct energy 28 along a path 30. Imprint head 20 and stage 10 are configured to arrange mold 16 and substrate 12, respectively, to be in superimposition and disposed in path 30. Either imprint head 20, stage 10, or both vary a distance between mold 16 and substrate 12 to define a desired volume therebetween that is filled by polymeric material 24.

Referring to FIG. 1, polymeric material 24 is disposed upon substrate 12 before the desired volume is defined between mold 16 and substrate 12. However, polymeric material 24 may fill the volume after the desired volume has been obtained. After the desired volume is filled with polymeric material 24, source 26 produces energy 28, e.g., broadband energy that causes polymeric material 24 to solidify and/or cross-link conforming to the shape of a surface 25 of substrate 12 and patterning surface 18, defining a patterned layer 50 on substrate 12.

The broadband energy may comprise an actinic component including, but not limited to, ultraviolet wavelengths, thermal energy, electromagnetic energy, visible light and the like. The actinic component employed is known to one skilled in the art and typically depends on the material from which imprinting layer 12 is formed. Control of this process is regulated by a processor 32 that is in data communication with stage 10, imprint head 20, fluid dispense system 22, source 26, operating on a computer readable program stored in memory 34.

The following three capabilities are thought to assist in make imprint lithography more efficient and attractive:

1. Creation and maintenance of pure Helium or other process gas atmosphere such as $CO_2$;
2. Partial or full vacuum imprinting (to reduce fill time, defects, and oxygen poisoning); and
3. Separation force reduction or elimination.

A chamber concept to create and maintain a pressure in the vicinity of the template creates a leak proof volume around the active area of the template that can then be pressurized with gas or evacuated. Due to the template geometry, the etched back region around the active area conveniently provides such a volume, when the template is in contact with a wafer. Since the etched back region is about 5-15 μm higher than the active area, it also provides a very high flow resistance to any gas/ fluid.

Figure 2:
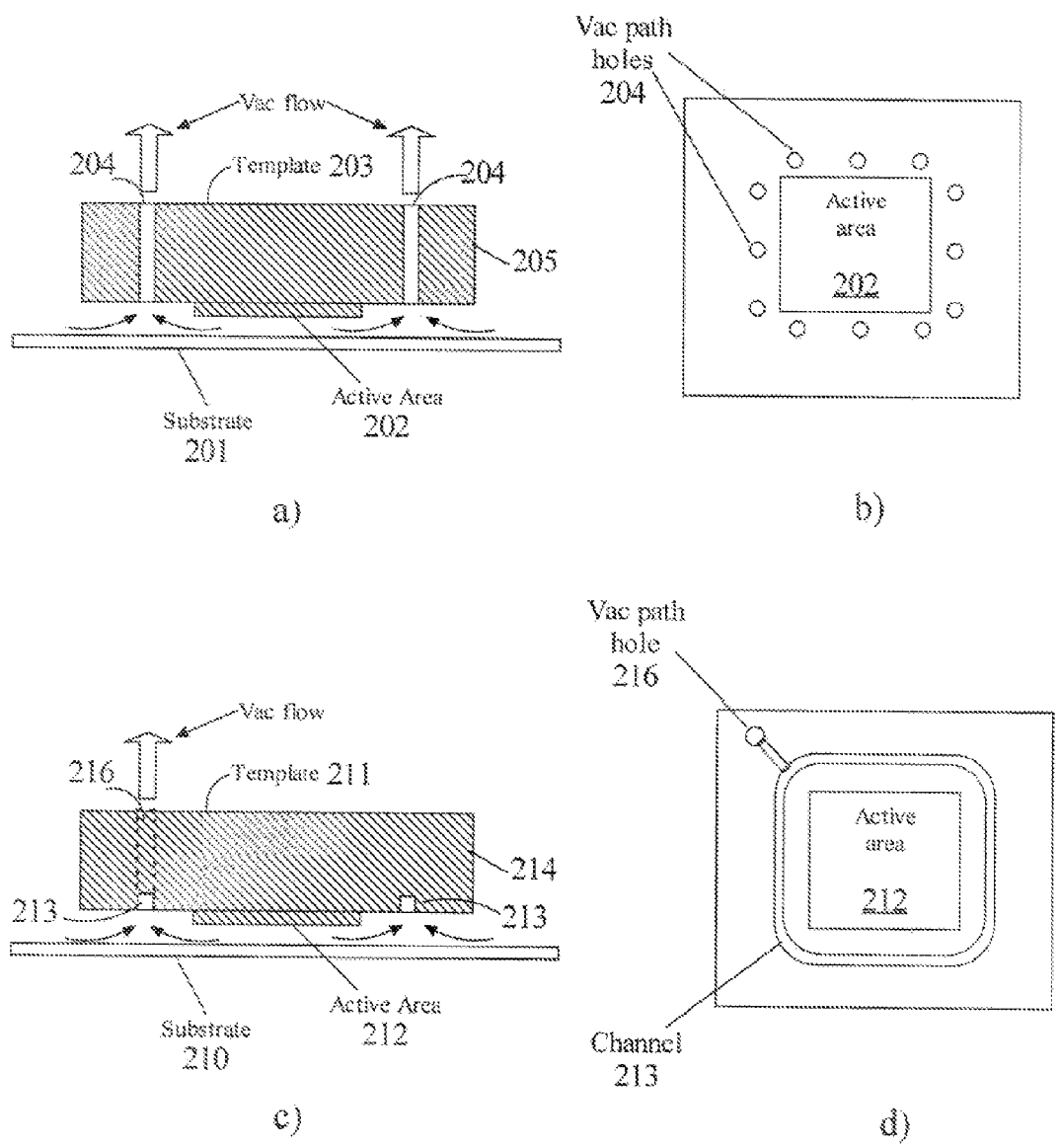
FIG. 2 illustrates a partial vacuum environment through a template: a) side view of a template with holes; b) top view of the template of a) with multiple holes; c) side view of a template with channel; d) top view of a template of c)

FIGS. 2a)-d) illustrate partial vacuum environments using a template 203-211 that has channels 213 or holes 204 for pneumatic flows. It is desirable to have a multiple source (e.g., holed 204) of the flow or a surrounding channel 213 in order to induce a uniform partial vacuum below the active area 202-212 of the template 205, 214. Vacuum-flow through the openings 204, 216 will pull away existing air or gas, which in the presence of a significant pressure drop due to the small but long gap, lowers the pressure between the active area 202, 212 and the substrate 201, 210. United States patent application publication 2005/0072755, filed as U.S. patent application Ser. No. 10/677,639, entitled "Single Phase Fluid Imprint Lithography Method" describes a method of introducing a flow between the template 203, 211 and the substrate 201, 210, which is incorporated by reference herein.

Figure 3:
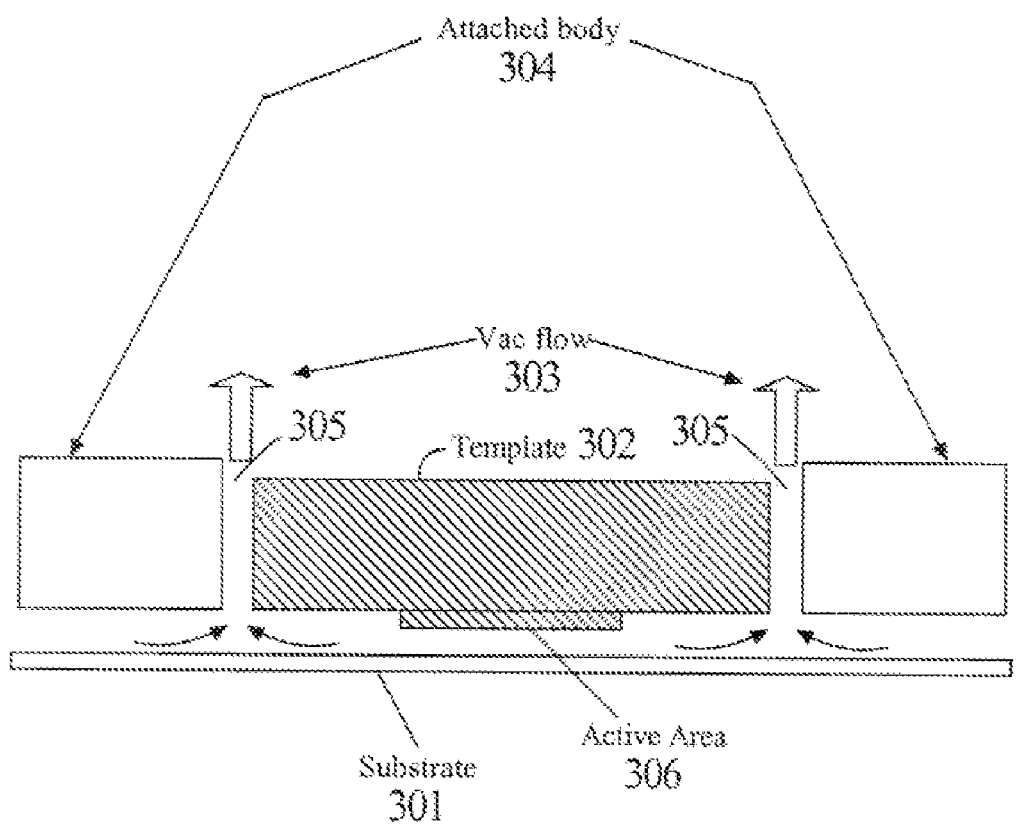
FIG. 3 illustrates an additional add-on plate.

Referring to FIG. 3, when the template 302 cannot be drilled or processed for the channel, it is possible to add additional plates 304 outside of the template 302 so that the small gap 305 between this added plate 304 and the template 302 can generate a necessary pneumatic pressure drop between the active area 306 and the substrate 301. In order to maintain the small gap in the range of 5-50 microns, the added extension parts can have an air bearing where it interfaces with the mating surface.

Figure 4A:
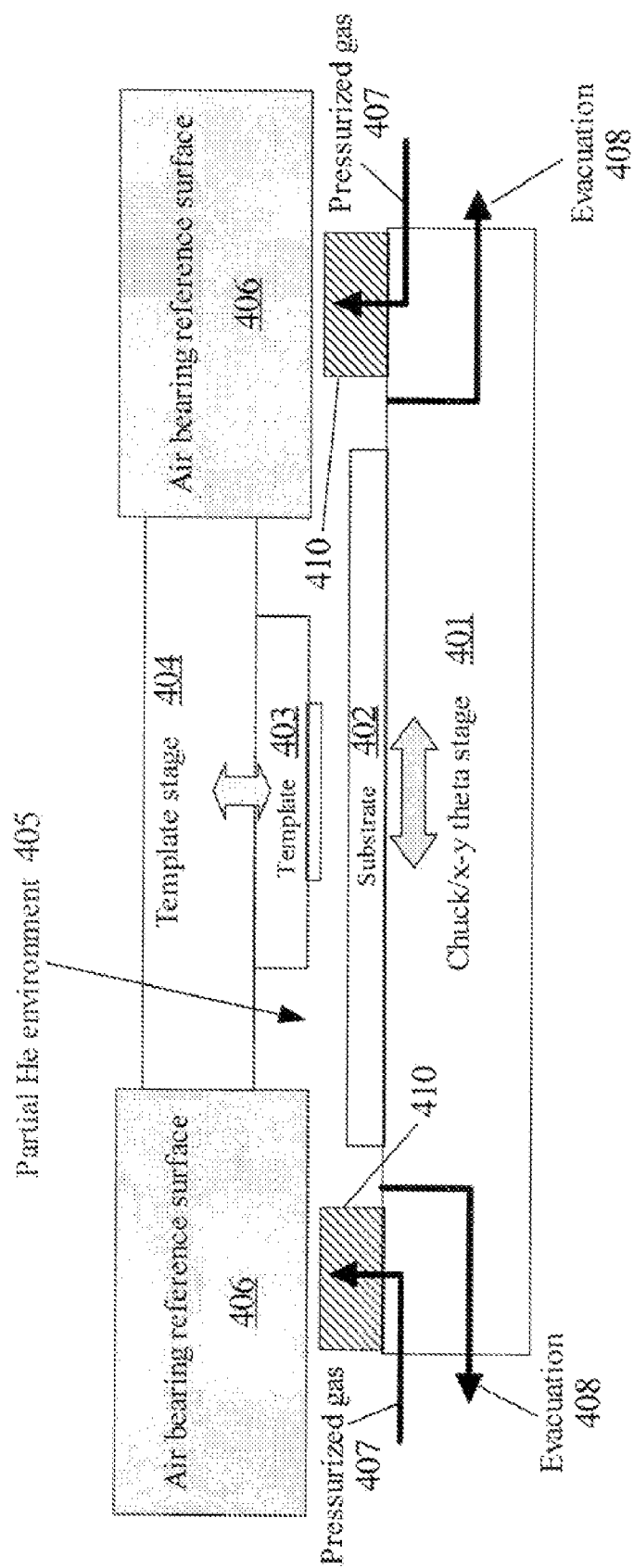
FIGS. 4A and 4B illustrate views of a partial vacuum environment using upward air bearing that acts as semi-sealing around the template.
Figure 4B:
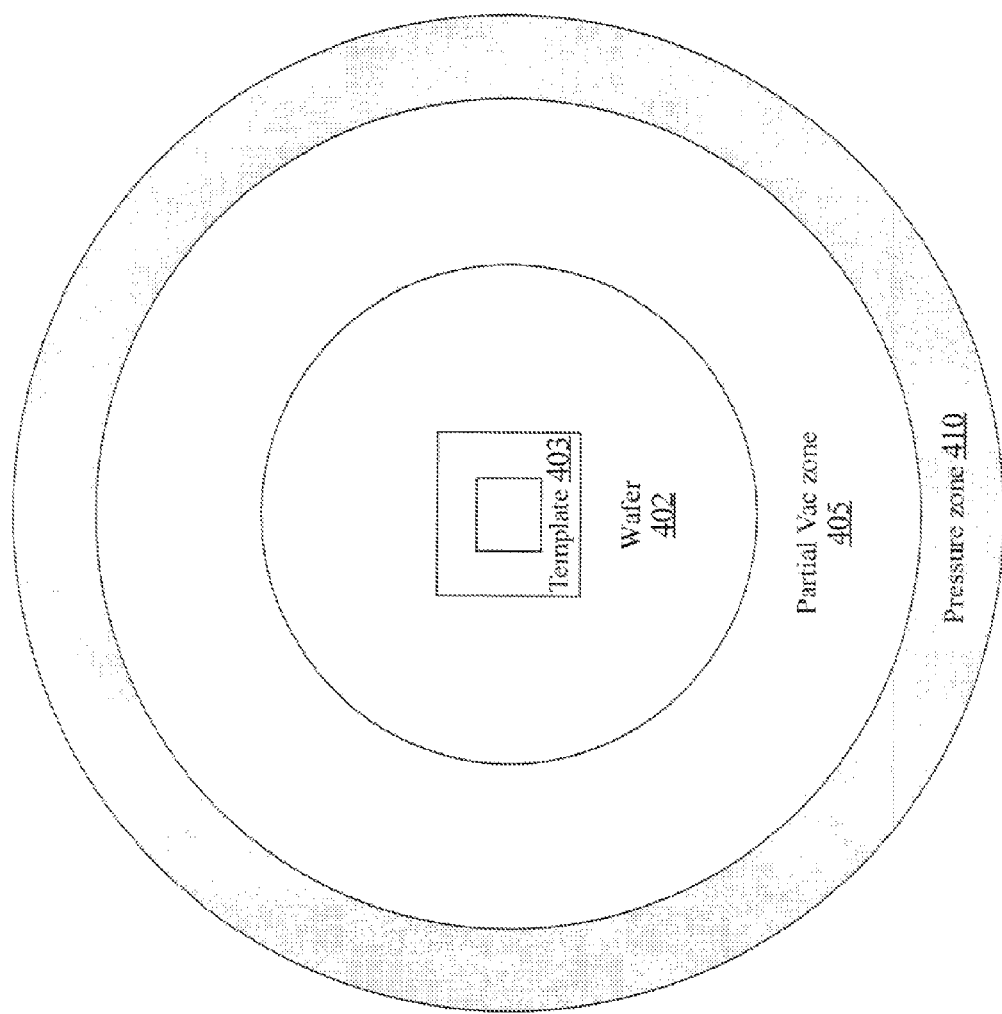

FIG. 4A illustrates a cross-section view of a partial pressure imprinting tool that creates partial pressure between the substrate 402 and template 403. Vacuum preloaded air bearings 410 can substantially seal the mini-environment 405 which can be filled with a suitable process gas (e.g., He) replacing air. The air bearing interface 410 is positioned adjacent the plate 406. Channels (not shown) can cause an evacuation 408 from the environment 405, while pressurized gas 407 can be channeled through the air bearing ring 410 in a balance of the air bearing reference surface 406 and corresponding template stage 404. Once the imprinting is completed for the wafer, the upward air bearing can be lowered to provide an access for the wafer I/O end-effecter. FIG. 4B is a top view of the partial pressure imprinting tool shown in FIG. 4A.

Figure 5:
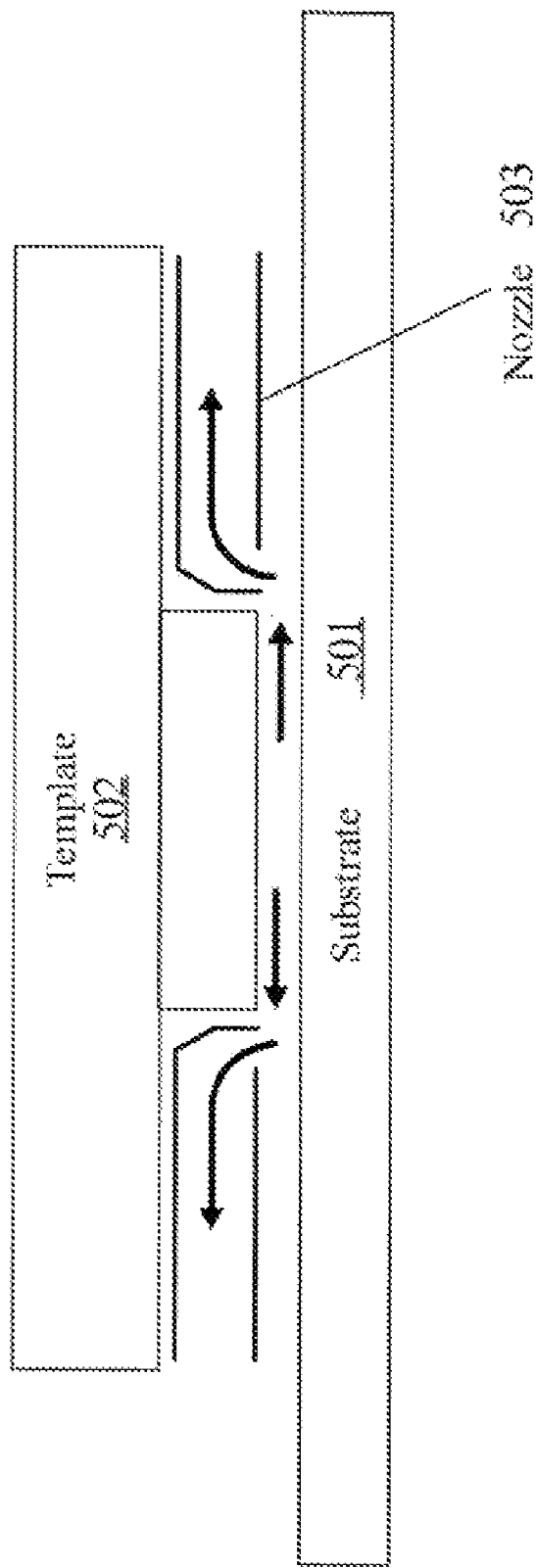
FIG. 5 illustrates an embodiment whereby a system of nozzles are utilized to create a partial He environment.

FIG. 5 illustrates an embodiment whereby a system of nozzles are utilized to create a partial He environment between the template 502 and the substrate 501.

The present invention is directed towards a method and a system to create and maintain a desired environment in the vicinity of a nano-imprint lithography template by creation of a partial vacuum using channels or holes in the template holding the nano-imprint mold.

The invention claimed is:

1. A system for creating a specific environment during a nanolithography imprinting process, comprising:
    a substrate disposed on a chuck surface;
    a template stage having an air bearing reference surface;
    an air bearing surface disposed around the substrate and interfacing with the air bearing reference surface creating an interface gap;
    a template coupled to the template stage and positioned in close proximity to the substrate creating a controlled volume surrounding a nano-imprint mold on the template and the substrate; and
    a means for creating a partial vacuum in the controlled volume surrounding the nano-imprint mold and the substrate thereby enabling a gas flow through the interface gap and the controlled volume to create the specific environment in the controlled volume.

2. The system as recited in claim 1, wherein the template comprises a plurality of holes positioned around the nano-imprint mold and passing through the template and the creating means utilizes the plurality of holes to create the partial evacuation of gas in the controlled volume surrounding the nano-imprint mold and the substrate.

3. The system as recited in claim 1, wherein the template further comprises a channel formed in the template around the nano-imprint mold, the channel coupled to the creating means.

4. The system as recited in claim 1, wherein the creating means further comprises a body with the air bearing surface positioned around the template in a configuration that creates the interface gap between sides of the template and sides of the body whereby air flow up through the interface gap evacuates gas from between the template and the substrate.

5. The system as recited in claim 1, further comprising a polymerizable fluid dispensed between the nano-imprint mold and the substrate.

* * * * *